(12) United States Patent
Surasing et al.

(10) Patent No.: US 9,781,841 B2
(45) Date of Patent: Oct. 3, 2017

(54) SOLDERING APPARATUS WITH AUTOMATIC ALIGNING FUNCTION

(71) Applicant: DET International Holding Limited, George Town (KY)

(72) Inventors: Ruay Surasing, Samutprakarn (TH); Pornthep Sukkee, Samutprakarn (TH); Kanueng Thongdee, Samutprakarn (TH)

(73) Assignee: DET INTERNATIONAL HOLDING LIMITED, George Town (KY)

( * ) Notice: Subject to any disclaimer, the term of this patent is extended or adjusted under 35 U.S.C. 154(b) by 125 days.

(21) Appl. No.: 14/670,866

(22) Filed: Mar. 27, 2015

(65) Prior Publication Data

US 2016/0279743 A1    Sep. 29, 2016

(51) Int. Cl.
| | | |
|---|---|---|
| *B23K 1/00* | (2006.01) | |
| *B23K 1/008* | (2006.01) | |
| *H05K 3/34* | (2006.01) | |
| *B23K 3/08* | (2006.01) | |
| *H05K 3/00* | (2006.01) | |

(52) U.S. Cl.
CPC .......... *H05K 3/3494* (2013.01); *B23K 1/008* (2013.01); *B23K 1/0016* (2013.01); *B23K 3/087* (2013.01); *H05K 3/0008* (2013.01)

(58) Field of Classification Search
CPC .. B23K 1/008; B23K 1/0053; B23K 2201/42; B23K 1/0016; H05K 3/3494; H05K 13/0465
USPC .... 219/388; 228/102, 10, 103, 179.1, 180.1, 228/43, 8
See application file for complete search history.

(56) References Cited

U.S. PATENT DOCUMENTS

| | | | |
|---|---|---|---|
| 5,345,061 A * | 9/1994 | Chanasyk | B23K 1/008 |
| | | | 219/388 |
| 5,770,835 A | 6/1998 | Sakuyama et al. | |
| 2010/0267188 A1* | 10/2010 | Parks | F27B 9/20 |
| | | | 438/87 |

FOREIGN PATENT DOCUMENTS

| | | |
|---|---|---|
| JP | 0353596 | 3/1991 |
| JP | 0669642 | 3/1994 |
| JP | 4073861 B2 | 4/2008 |
| TW | 214753 | 10/1993 |
| TW | 289033 | 10/2007 |

* cited by examiner

*Primary Examiner* — Erin Saad
(74) *Attorney, Agent, or Firm* — Kirton McConkie; Evan R. Witt

(57) ABSTRACT

A soldering apparatus includes a reflow oven, a transmission mechanism, and a controlling unit. The reflow oven includes an inlet and an output mechanism. The output mechanism includes two guide rails and two link belts. An end of a first guide rail has a first alignment structure. The two link belts are movably disposed on the guide rails for outputting a printed wiring board. A distance between the guide rails is previously adjusted to be equal to a width of the printed wiring board. The transmission mechanism includes two tracks and two conveyor belts. An end of a first track has a second alignment structure. The two conveyor belts are movably disposed on the two tracks for transporting the printed wiring board. The controlling unit controls a movement of the first track, so that the first alignment structure and the second alignment structure are automatically aligned with each other.

7 Claims, 5 Drawing Sheets

SOLDERING APPARATUS WITH AUTOMATIC ALIGNING FUNCTION

FIELD OF THE INVENTION

The present invention relates to a soldering apparatus, and more particularly to a soldering apparatus with an automatic aligning function.

BACKGROUND OF THE INVENTION

A soldering apparatus is widely used to weld electronic components on a printed wiring board. FIG. 1 is a schematic perspective view illustrating a conventional soldering apparatus. As shown in FIG. 1, the conventional soldering apparatus 1 comprises a transmission mechanism 11 and a soldering oven 12. The transmission mechanism 11 comprises an outlet 110, two tracks 111 and two conveyor belts 112. The two conveyor belts 112 are in parallel with each other and movably disposed on the two tracks 111. The two conveyor belts 112 are used for transporting a printed wiring board 2 along with electronic components (not shown) into the soldering oven 12. After the printed wiring board 2 is introduced into the soldering oven 12, a reflow soldering process is performed to weld the electronic components on the printed wiring board 2. The soldering oven 12 comprises an inlet 120, an outlet 121 and an output mechanism 13. The output mechanism 13 comprises two guide rails 131, two link belts 132 and a guide rail adjusting member 133. The two link belts 132 are in parallel with each other and movably disposed on the two guide rails 131, respectively. After the printed wiring board 2 is introduced into the soldering oven 12, the two link belts 132 are driven by a motor (not shown) to support the printed wiring board 2 and move the printed wiring board 2 in the direction A. Consequently, the reflow soldering process can be performed by the soldering oven 12. The guide rail adjusting member 133 is disposed over the two guide rails 131 and linked with the two guide rails 131. The two guide rails 131 are movable relative to the guide rail adjusting member 133, so that the distance between the two guide rails 131 is adjustable.

FIG. 2 is a schematic view illustrating the relationship between the transmission mechanism and the reflow oven of the conventional soldering apparatus of FIG. 1. As shown in FIG. 2, before the reflow soldering process is performed, the operator has to manually adjust the output mechanism 13 of the soldering oven 12. In particular, by manually adjusting the guide rail adjusting member 133, one guide rail 131a of the two guide rails 131 is horizontally moved in the direction B1. Consequently, the distance d2 between the two guide rails 131 is equal to the distance d1 between the two tracks 111 of the transmission mechanism 11 (i.e., the width w of the printed wiring board 2). After the distance d2 between the two guide rails 131 is manually adjusted, the printed wiring board 2 is placed on the two tracks 111 of the transmission mechanism 11. Consequently, the printed wiring board 2 is transported to the outlet 110 by the two conveyor belts 112. Then, the printed wiring board 2 is transported to the output mechanism 13 of the soldering oven 12. Then, the printed wiring board 2 is transported into the soldering oven 12 by the two link belts 132, so that the reflow soldering process is performed. Then, the printed wiring board 2 with the mounted electronic components is outputted from the outlet 121.

As mentioned above, the distance d2 between the two guide rails 131 of the soldering oven 12 can be adjusted according to the width w of the printed wiring board 2 before the reflow soldering process is performed. Although the distance d2 between the two guide rails 131 of the soldering oven 12 is adjustable, the conventional soldering apparatus 1 has no mechanism for aligning the two guide rails 131 with the two tracks 111 of the transmission mechanism 11. Consequently, after the distance d2 between the two guide rails 131 and the distance d1 between the two tracks 111 of the transmission mechanism 11 are adjusted to be equal to the width w of the printed wiring board 2 by the operator, there is a slight misalignment between the two guide rails 131 and the two tracks 111. When the printed wiring board 2 is transported to the outlet 110 of the transmission mechanism 11 and the inlet 120 of the soldering oven 12, the external forces applied to the bilateral sides of the printed wiring board 2 are not balanced because of the misalignment. The unbalanced external forces may cause the vibration of the printed wiring board 2. Under this circumstance, the printed wiring board 2 is rocked and fails to lie flat. Since the printed wiring board 2 fails to be smoothly transported through the soldering oven 12, the printed wiring board 2 possibly drops down or escapes from the soldering apparatus 1. In other words, the misalignment may adversely affect the subsequent reflow soldering process, reduce the product yield and decreases the throughput.

Therefore, there is a need of providing a soldering apparatus with an automatic aligning function in order to eliminate the above drawbacks.

SUMMARY OF THE INVENTION

An object of the present invention provides a soldering apparatus with an automatic aligning function. Consequently, the subsequent reflow soldering process can be smoothly performed, and the product yield and the throughput will be increased.

In accordance with an aspect of the present invention, there is provided a soldering apparatus with an automatic aligning function. The soldering apparatus includes a reflow oven, a transmission mechanism and a controlling unit. The reflow oven includes an inlet and an output mechanism. The output mechanism includes two parallel guide rails and two link belts. An end of a first guide rail of the two guide rails has a first alignment structure. The two link belts are movably disposed on the two guide rails for outputting a printed wiring board. A distance between the two guide rails is previously adjusted to be equal to a width of the printed wiring board. The transmission mechanism includes an outlet, two parallel tracks and two conveyor belts. The outlet corresponds to the inlet of the reflow oven. An end of a first track of the two tracks has a second alignment structure corresponding to the first alignment structure. The two conveyor belts are movably disposed on the two tracks for transporting the printed wiring board. The controlling unit controls a movement of the first track. As the first track is moved relative to the first guide rail, the first alignment structure and the second alignment structure are aligned with each other.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
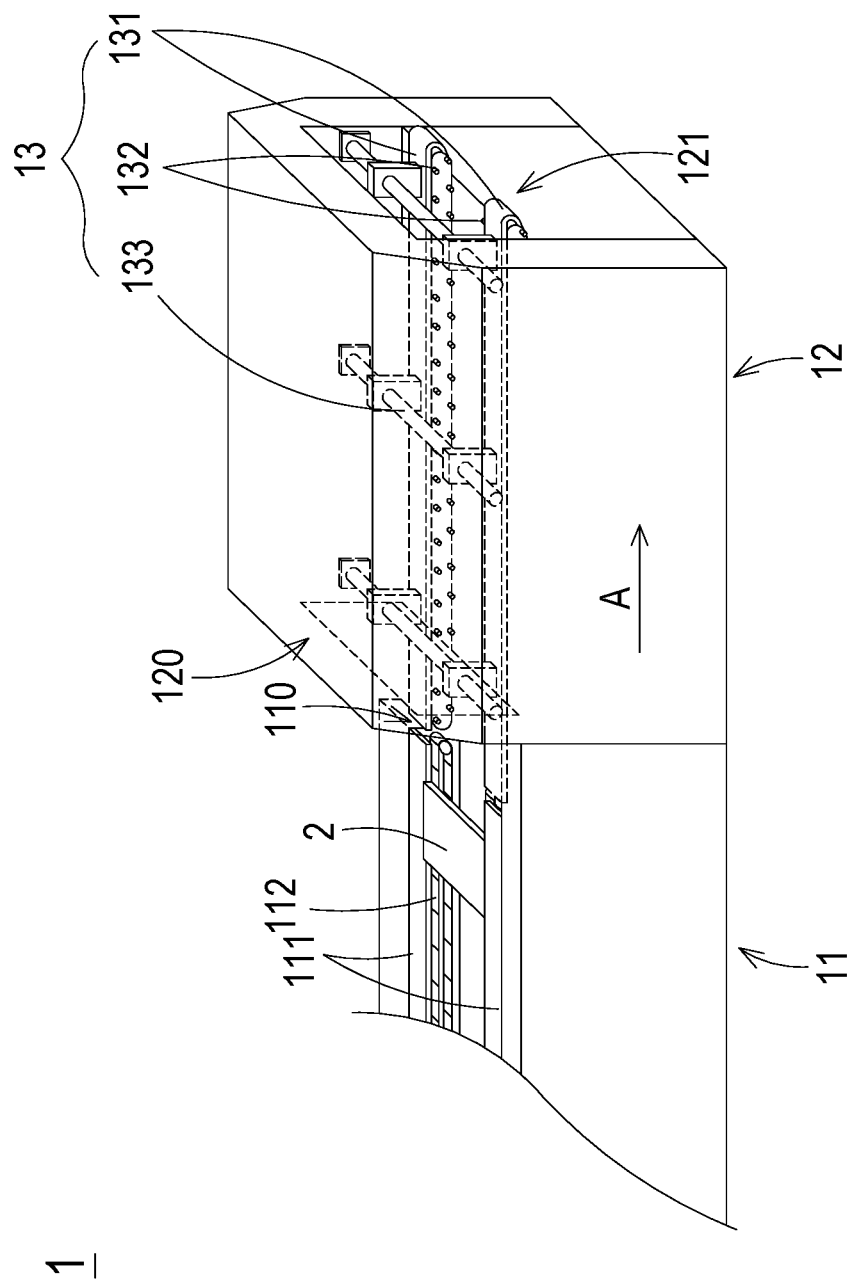
FIG. 1 is a schematic perspective view illustrating a conventional soldering apparatus.
Figure 2:
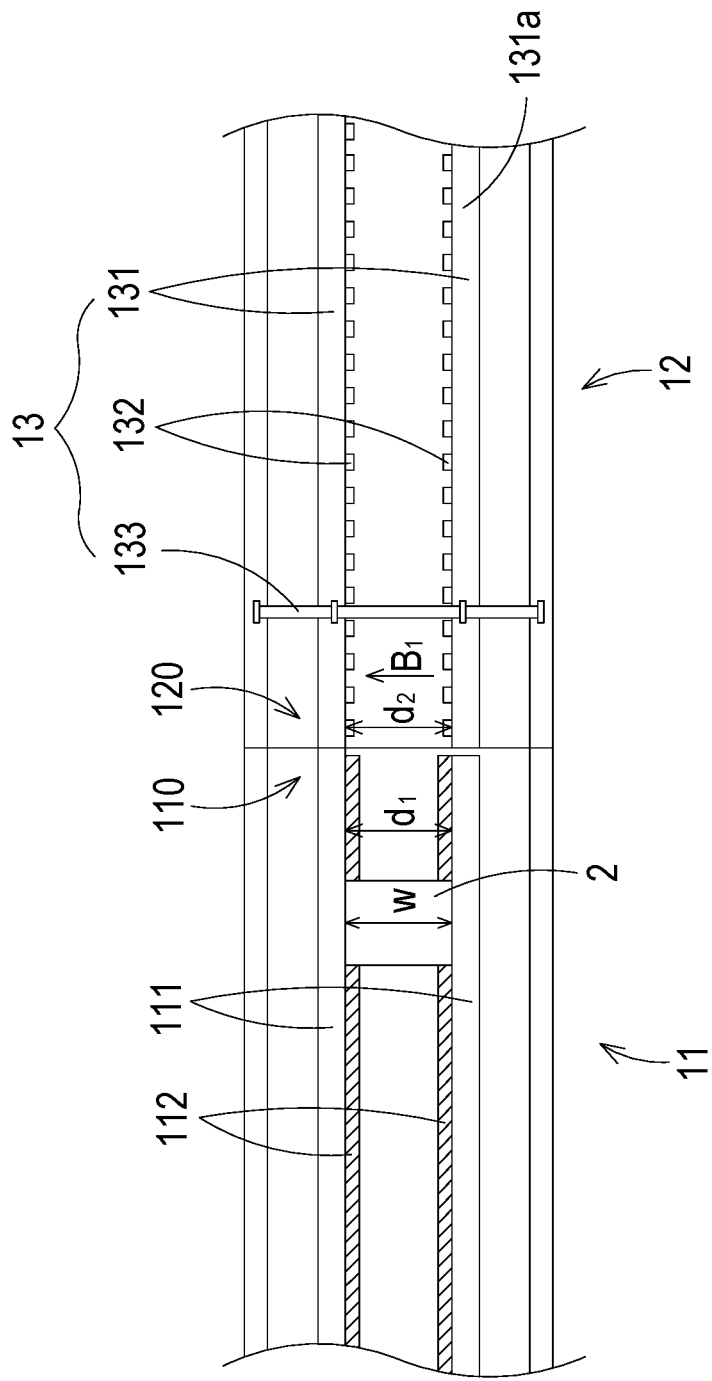
FIG. 2 is a schematic view illustrating the relationship between the transmission mechanism and the reflow oven of the conventional soldering apparatus of FIG. 1.
Figure 3:
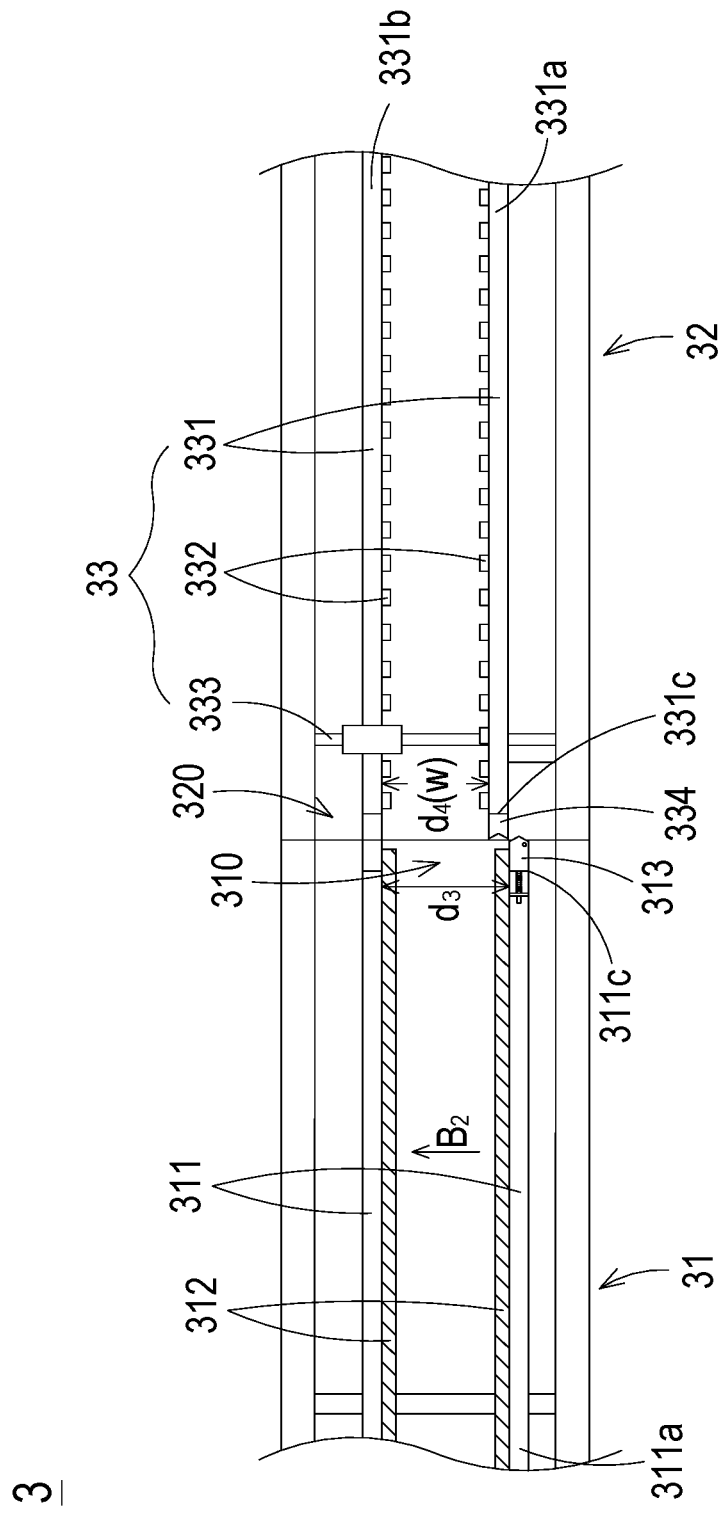
FIG. 3 is a schematic view illustrating the relationship between a transmission mechanism and a reflow oven of a soldering apparatus according to an embodiment of the present invention before an automatic aligning process is performed.

FIG. 3 is a schematic view illustrating the relationship between a transmission mechanism and a reflow oven of a soldering apparatus according to an embodiment of the present invention before an automatic aligning process is performed. As shown in FIG. 3, the soldering apparatus 3 comprises a transmission mechanism 31, a soldering oven 32 and a controlling unit (not shown). The soldering oven 32 is used for performing a reflow soldering process. The transmission mechanism 31 is used for transporting a printed wiring board along with electronic components (not shown) from a front stage to the soldering oven 32. After the printed wiring board 4 is introduced into the soldering oven 32, the reflow soldering process is performed to weld the electronic components on the printed wiring board 4. The controlling unit is electrically connected with the soldering oven 32 and the transmission mechanism 31.

In this embodiment, the soldering oven 32 comprises an inlet 320, an outlet (not shown) and an output mechanism 33. The output mechanism 33 comprises two guide rails 331, two link belts 332, a guide rail adjusting member 333 and a first alignment structure 334. The inlet 320 is located near front ends 331c of the two guide rails 331. The two guide rails 331 are in parallel with each other and disposed within the soldering oven 32. The two link belts 332 are movably disposed on the two guide rails 331. After the printed wiring board 4 is introduced into the soldering oven 32, the printed wiring board 4 is supported on and transported by the two link belts 332. The first alignment structure 334 is located at the front end 331c of the first guide rail 331a. In this embodiment, the guide rail adjusting member 333 is penetrated through the two guide rails 331. The first guide rail 331a with the first alignment structure 334 is movable relative to the guide rail adjusting member 333. Consequently, the distance d4 between the two guide rails 331 is adjustable. Before an automatic aligning process is performed, the distance d4 between the two guide rails 331 is adjusted to be equal to the width w of the printed wiring board 4. It is noted that numerous modifications and alterations may be made while retaining the teachings of the present invention. For example, in another embodiment, the second guide rail 331b without the first alignment structure 334 is movable relative to the guide rail adjusting member 333.

Please refer to FIG. 3 again. The transmission mechanism 31 of the soldering apparatus 3 comprises an outlet 310, two tracks 311, two conveyor belts 312 and a second alignment structure 313. The outlet 310 is located near rear ends 311c of the two tracks 311. The two tracks are in parallel with each other. The two conveyor belts 312 are movably disposed on the two tracks 311. The two conveyor belts 312 are used for supporting and transporting the printed wiring board 4 into the soldering oven 32. The second alignment structure 313 is located at the rear end 311c of the first track 311a. Moreover, the second alignment structure 313 corresponds to the first alignment structure 334. In this embodiment, the controlling unit controls the first track 311a to be moved in the direction B2. Until the second alignment structure 313 at the first track 311a and the first alignment structure 334 at the first guide rail 331a of the output mechanism 33 are aligned with each other, the automatic aligning process is completed.

Figure 4:
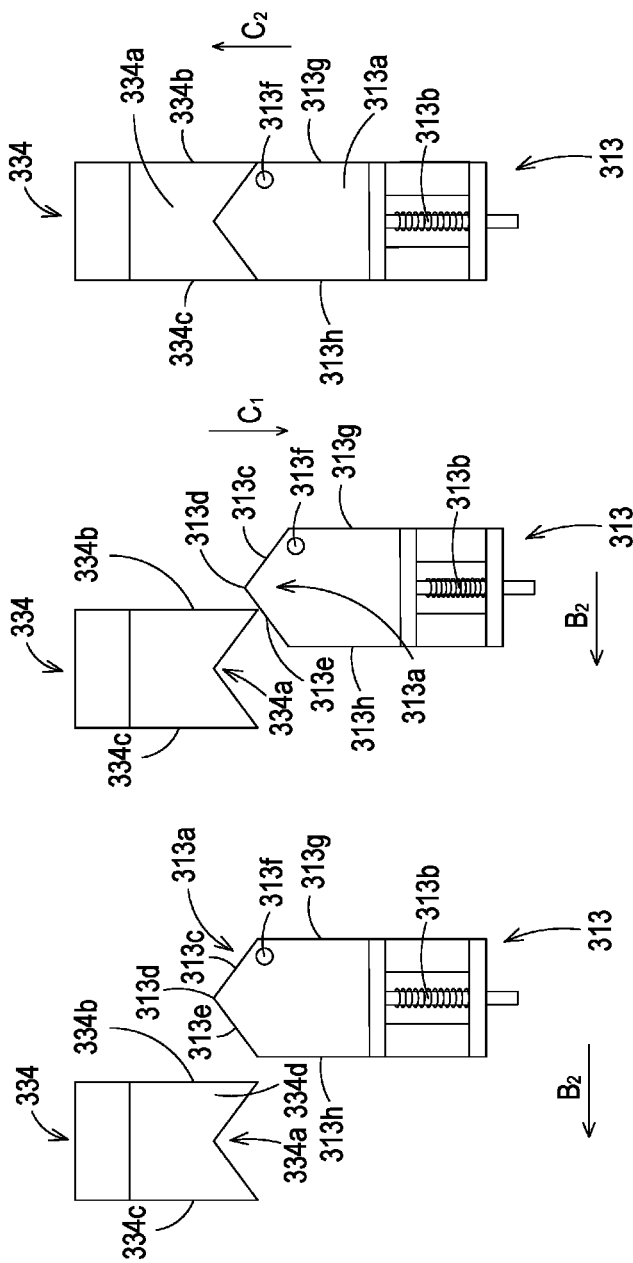
FIGS. 4A-4C schematically illustrate the steps of performing the automatic aligning process of aligning the second alignment structure with the first alignment structure by the soldering apparatus of the present invention.

FIGS. 4A-4C schematically illustrate the steps of performing the automatic aligning process of aligning the second alignment structure with the first alignment structure by the soldering apparatus of the present invention. In this embodiment, the first alignment structure 334 comprises a concave part 334a, a first lateral side 334b and a second lateral side 334c. The concave part 334a has a tapered shape, a triangular shape or any other appropriate shape. Moreover, two protrusion structures 334d are defined by the concave part 334a, the first lateral side 334b and the second lateral side 334c collaboratively. The second alignment structure 313 comprises a convex part 313a, an elastic element 313b, a third lateral side 313g and a fourth lateral side 313h. The profile of the convex part 313a of the second alignment structure 313 matches the profile of the concave part 334a of the first alignment structure 334. In this embodiment, the concave part 334a is a tapered recess, and thus the convex part 313a of the second alignment structure 313 is a tapered bulge. It is noted that the profiles of the first alignment structure 334 and the second alignment structure 313 are not restricted. In this embodiment, the convex part 313a of the second alignment structure 313 comprises a first slant 313c, a tip 313d and a second slant 313e. A first end of the elastic element 313b is connected with the convex part 313a. A second end of the elastic element 313b is connected with the rear end 311c of the track 311. An example of the elastic element 313b includes but is not limited to a spring.

Please refer to FIGS. 3 and 4A-4C. The automatic aligning process comprises the following steps. Firstly, as shown in FIG. 4A, the controlling unit controls the first track 311a of the transmission mechanism 31 to be moved horizontally in the direction B2. Consequently, the second alignment structure 313 at the first track 311a is gradually moved toward the first alignment structure 334 at the first guide rail 331a of the output mechanism 33.

As the second alignment structure 313 is moved in the direction B2, the second alignment structure 313 is contacted with the first alignment structure 334. As shown in FIG. 4B, the second slant 313e of the second alignment structure 313 is firstly contacted with the first lateral side 334b of the first alignment structure 334. Meanwhile, the first lateral side 334b of the first alignment structure 334 provides a pushing force to the second slant 313e of the second alignment structure 313. The pushing force is transmitted in the direction C1 from the convex part 313a to the elastic element 313b. The first alignment structure 334 is fixed on the first guide rail 331a. Consequently, as the second alignment structure 313 is continuously moved in the direction B2, the first protrusion structures 334d defined by the concave part 334a and the first lateral side 334b of the first alignment structure 334 will be continuously moved along the second slant 313e of the second alignment structure 313 provide the pushing force to the elastic element 313b. In response to the pushing force, the elastic element 313b is compressed in the direction C1 and the second alignment structure 313 is smoothly moved relative to the first alignment structure 334.

As the second alignment structure 313 is continuously moved in the direction B2, the tip 313d of the convex part 313a is moved across the first protrusion structures 334d, which is defined by the concave part 334a and the first lateral side 334b of the first alignment structure 334. Then, as shown in FIG. 4C, the convex part 313a is moved in the direction C2 in response to the elastic restoring force of the elastic element 313b. Consequently, the convex part 313a of the second alignment structure 313 and the concave part 334a of the first alignment structure 334 are engaged with each other. Meanwhile, the first lateral side 334b of the first alignment structure 334 and the third lateral side 313g of the second alignment structure 313 are coplanar, and the second lateral side 334c of the first alignment structure 334 and the fourth lateral side 313h of the second alignment structure 313 are coplanar. After the alignment between the first alignment structure 334 and the second alignment structure 313 is achieved, the process of automatically aligning the transmission mechanism 31 and the output mechanism 33 is completed.

In some embodiments, the second alignment structure 313 further comprises an indication lamp 313f. After the automatic alignment between the first alignment structure 334 and the second alignment structure 313 is completed (see FIG. 4C), the controlling unit controls the indication lamp 313f to emit a prompt light to notify the operator that the automatic aligning process is completed. Then, the printed wiring board 4 can be placed on the tracks 311 of the transmission mechanism 31 and thus the subsequent reflow soldering process will be performed.

Figure 5:
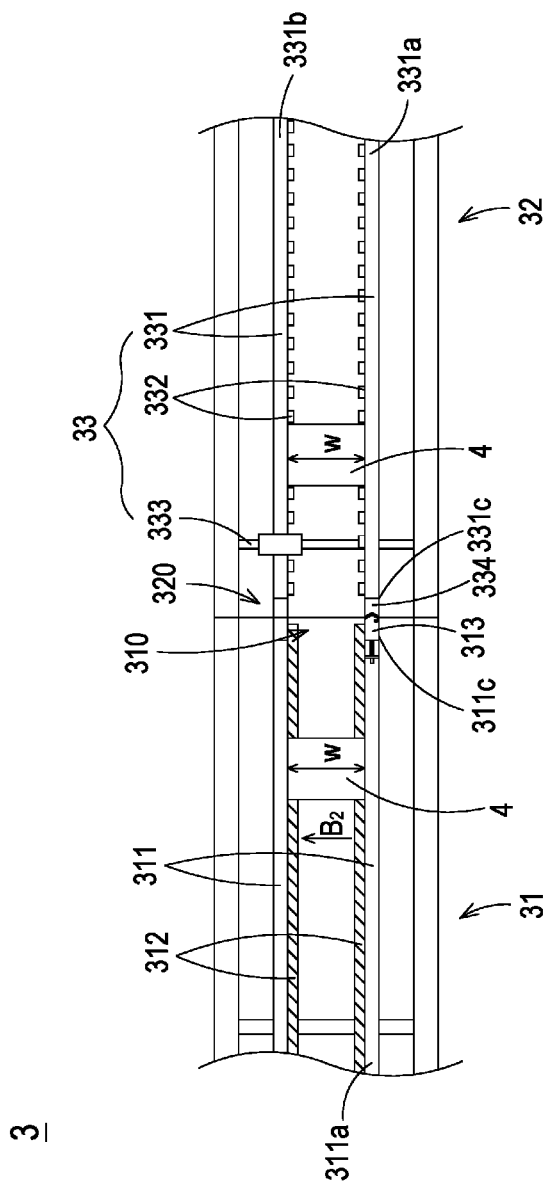
FIG. 5 is a schematic view illustrating the relationship between the transmission mechanism and the reflow oven of the soldering apparatus according to the embodiment of the present invention after the automatic aligning process is completed.

FIG. 5 is a schematic view illustrating the relationship between the transmission mechanism and the reflow oven of the soldering apparatus according to the embodiment of the present invention after the aligning process is completed. Before the process of automatically aligning the transmission mechanism 31 and the output mechanism 33, the first guide rail 331a with the first alignment structure 334 is moved relative to the guide rail adjusting member 333, so that the distance d4 between the two guide rails 331 is adjusted to be equal to the width w of the printed wiring board 4. Then, under control of the controlling unit, the first track 311a of the transmission mechanism 31 with the second alignment structure 313 is moved in the direction B2. Until the second alignment structure 313 at the first track 311a and the first alignment structure 334 at the first guide rail 331a of the output mechanism 33 are aligned with each other, the automatic aligning process between transmission mechanism 31 and the output mechanism 33 is completed. That is, the tracks 311 of the transmission mechanism 31 and the guide rails 331 of the output mechanism 33 are precisely aligned with each other. When the printed wiring board 4 is transported to the outlet 310 of the transmission mechanism 31 or the inlet 320 of the soldering oven 32, the printed wiring board 4 can be smoothly transported to the soldering oven 32 because the tracks 311 and the guide rails 331 are precisely aligned with each other. Consequently, the subsequent reflow soldering process can be smoothly performed.

From the above descriptions, the present invention provides a soldering apparatus with an automatic aligning function. The soldering apparatus comprises a transmission mechanism and an output mechanism. A guide rail of the output mechanism has a first alignment structure. A track of the transmission mechanism has a second alignment structure. Before a reflow soldering process is performed, the first alignment structure and second alignment structure are aligned with each other under control of a controlling unit. Consequently, the distance between two tracks of the transmission mechanism and the distance between two guide rails of the output mechanism are equal to the width of the printed wiring board. Since the tracks of the transmission mechanism and the guide rails of the output mechanism are automatically and precisely aligned with each other, the printed wiring board can be smoothly transported to the soldering oven. In other words, the subsequent reflow soldering process is smoothly performed, and the product yield and the throughput are both increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A soldering apparatus with an automatic aligning function, the soldering apparatus comprising:
    a reflow oven comprising an inlet and an output mechanism, wherein the output mechanism comprises two parallel guide rails and two link belts, wherein an end of a first guide rail of the two guide rails has a first alignment structure, and the two link belts are movably disposed on the two guide rails for outputting a printed wiring board, wherein a distance between the two guide rails is previously adjusted to be equal to a width of the printed wiring board;
    a transmission mechanism comprising an outlet, two parallel tracks and two conveyor belts, wherein the outlet corresponds to the inlet of the reflow oven, an end of a first track of the two tracks has a second alignment structure corresponding to the first alignment structure of the reflow oven, and the two conveyor belts are movably disposed on the two tracks for transporting the printed wiring board; and
    a controlling unit configured for controlling a movement of the first track, wherein as the first track is moved relative to the first guide rail, the first alignment structure and the second alignment structure are automatically aligned with each other.

2. The soldering apparatus according to claim 1, wherein the output mechanism further comprises a guide rail adjusting member, wherein the first guide rail is movable relative to the guide rail adjusting member, so that the distance between the two guide rails is adjustable.

3. The soldering apparatus according to claim 1, wherein the first alignment structure has a concave part, and the second alignment structure has a convex part, wherein a profile of the second alignment structure matches a profile of the first alignment structure.

4. The soldering apparatus according to claim 3, wherein the concave part is a tapered recess, and the convex part is a tapered bulge.

5. The soldering apparatus according to claim 4, wherein the second alignment structure further comprises an elastic element, and the elastic element is connected with the convex part, wherein as the first track is moved relative to the first guide rail under control of the controlling unit, a first lateral side of the first alignment structure is contacted with the convex part of the second alignment structure to compress the elastic element, and then the convex part of the second alignment structure is engaged with the concave part of the first alignment structure in response to an elastic restoring force of the compressed elastic element, wherein when the convex part of the second alignment structure is engaged with the concave part of the first alignment structure, an automatic aligning process is completed.

6. The soldering apparatus according to claim 5, wherein the second alignment structure further comprises an indication lamp, wherein after the automatic aligning process is completed, the controlling unit controls the indication lamp to emit a prompt light to indicate that the automatic aligning process is completed.

7. The soldering apparatus according to claim 5, wherein after the automatic aligning process is completed, the first lateral side of the first alignment structure and a third lateral side of the second alignment structure are coplanar, and a second lateral side of the first alignment structure and a fourth lateral side of the second alignment structure are coplanar.

* * * * *